(12) United States Patent
Nakai (10) Patent No.: US 9,864,002 B2
(45) Date of Patent: Jan. 9, 2018

(54) SENSOR OUTPUT DETERMINATION APPARATUS

(71) Applicant: DENSO CORPORATION, Kariya, Aichi-pref. (JP)

(72) Inventor: Yasuhiro Nakai, Kariya (JP)

(73) Assignee: DENSO CORPORATION, Kariya (JP)

( * ) Notice: Subject to any disclaimer, the term of this patent is extended or adjusted under 35 U.S.C. 154(b) by 248 days.

(21) Appl. No.: 14/706,365

(22) Filed: May 7, 2015

(65) Prior Publication Data

US 2015/0323606 A1 Nov. 12, 2015

(30) Foreign Application Priority Data

May 8, 2014 (JP) .................................. 2014-096851

(51) Int. Cl.
*G01R 31/28* (2006.01)
*G01R 35/00* (2006.01)
*G01R 31/34* (2006.01)

(52) U.S. Cl.
CPC ......... *G01R 31/2829* (2013.01); *G01R 35/00* (2013.01); *G01R 31/343* (2013.01)

(58) Field of Classification Search
None
See application file for complete search history.

(56) References Cited

U.S. PATENT DOCUMENTS

| 2012/0025745 A1* | 2/2012 | D'Angelo | H02P 21/22 318/400.04 |
| 2013/0322487 A1 | 12/2013 | Watanabe et al. | |
| 2015/0377939 A1* | 12/2015 | Ishihara | G01R 29/18 324/107 |

FOREIGN PATENT DOCUMENTS

| JP | 2009-171312 | 7/2009 |
| JP | 2013-118746 | 6/2013 |
| JP | 2013-250175 | 12/2013 |

* cited by examiner

*Primary Examiner* — Melissa Koval
*Assistant Examiner* — Felicia Farrow
(74) *Attorney, Agent, or Firm* — Nixon & Vanderhye P.C.

(57) ABSTRACT

In a sensor output determination apparatus, a converter converts analog outputs of two sensors of a first-phase to two digital signals representing a current of the first-phase, and converts analog outputs of two sensors of a second-phase to two digital signals representing a current of the second-phase. The determination section determines whether the analog outputs of the two sensors of the first-phase are normal based on the two digital signals representing the current of the first-phase, and determines whether the analog outputs of the two sensors of the second-phase are normal based on the two digital signals representing the current of the second-phase. The transmission section transmits one of the two digital signals representing the current of the first-phase, one of the two digital signals representing the current of the second-phase, and a digital signal representing a result of determinations of the determination section, to the outside of the apparatus.

7 Claims, 7 Drawing Sheets

SENSOR OUTPUT DETERMINATION APPARATUS

CROSS-REFERENCE TO RELATED APPLICATION

This application is based on and claims the benefit of priority from earlier Japanese Patent Application No. 2014-96851 filed May 8, 2014, the description of which is incorporated herein by reference.

BACKGROUND

Technical Field

The present invention relates to a sensor output determination apparatus which determines whether or not outputs of a plurality of sensors are normal.

Related Art

An inverter is known which controls currents flowing through phases of a three-phase motor and detects the currents by current sensors (JP-A-2013-118746).

In many cases, a controller controlling a switching circuit of an inverter is housed in a housing of the inverter. In this case, output voltage of a current sensor is inputted to the controller. The controller determines whether or not the output voltage of the current sensor, that is, a current value, is normal. If the current value of each phase is not abnormal, the controller controls the switching circuit based on the current value of each phase.

A controller provided outside the housing of the inverter may control the switching circuit of the inverter. In this case, the distance between the current sensor and the controller is longer compared with a configuration in which the controller is housed in the housing of the inverter. Thus, considering noise easily superimposed on the output voltage of the current sensor, output voltage of the current sensor (analog signal) is required to be converted into a digital signal so as to be transmitted to the controller. However, since the digital signal representing a current of each phase (output voltage of the current sensor) has many bits, the amount of data to be transmitted cannot be prevented from increasing.

Note that, the above condition is mostly common not only in the configuration in which whether or not the current of each phase of the three-phase motor is normal is determined, but also to the configuration in which whether or not outputs of a plurality of sensors are normal is determined.

SUMMARY

An embodiment provides a sensor output determination apparatus which determines whether or not outputs of a plurality of sensors are normal to prevent the amount of data to be transmitted to the outside of the apparatus from increasing.

As an aspect of the embodiment, a sensor output determination apparatus is provided which determines whether or not analog outputs of two current sensors detecting a current of a first phase of a three-phase rotary machine and analog outputs of two current sensors detecting a current of a second phase of the three-phase rotary machine are normal. The apparatus includes: a converter which converts the analog outputs of the two current sensors of the first phase and the analog outputs of the two current sensors of the second phase to two digital signals representing the current of the first phase and two digital signals representing the current of the second phase; a determination section which determines whether or not the analog outputs of the two current sensors of the first phase are normal based on the two digital signals representing the current of the first phase, and determines whether or not the analog outputs of the two current sensors of the second phase are normal based on the two digital signals representing the current of the second phase; and a transmission section which transmits any one of the two digital signals representing the current of the first phase, any one of the two digital signals representing the current of the second phase, and a digital signal representing a result of the determinations of the determination section, to the outside of the apparatus.

DETAILED DESCRIPTION OF THE PREFERRED EMBODIMENTS

With reference to the accompanying drawings, hereinafter are described some embodiments of the present invention.

First Embodiment

In the present embodiment, a control system is embodied which controls a motor serving as a traction unit installed in, for example, an electric automobile.

Figure 1:
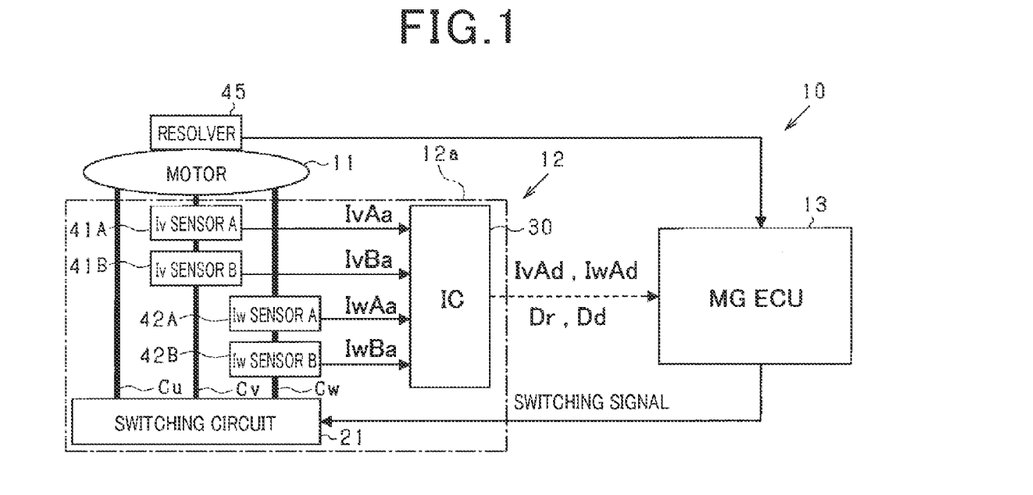
FIG. 1 is a schematic diagram showing a control system of a motor according to a first embodiment.

First, a schematic configuration of a control system 10 of a motor 11 is explained with reference to FIG. 1. The control system 10 includes the motor 11, an inverter 12, a controller 13 (MG ECU).

The motor 11 (three-phase rotary machine) is an in-vehicle traction unit, and has a rotor mechanically connected to drive wheels of an automobile. The motor 11 is a three-phase permanent magnet synchronous motor. The motor 11 is connected to a high-voltage battery (not shown) via the inverter 12.

The inverter 12 includes a switching circuit 21, current sensors 41A, 41B, 42A, 42B, and a phase current detection IC 30. The switching circuit 21, the current sensors 41A, 41B, 42A, 42B, and the IC 30 are housed in a housing 12a of the inverter 12.

The switching circuit 21 is a known bridge circuit including three series connections of switching elements. Connection points of the series connections are respectively connected to a U-phase cable Cu, a V-phase cable Cv, and a W-phase cable Cw of the motor 11. As the switching element, for example, an insulated gate bipolar transistor (IGBT) is used. Each of the switching elements is connected to a diode in inverse parallel. The sum of currents flowing through the U-phase cable Cu, the V-phase cable Cv, and the W-phase cable Cw becomes theoretically zero.

V-phase current sensors 41A, 41B are attached to the V-phase cable Cv (first phase) of the motor 11 to detect a current flowing through the V-phase cable Cv. The V-phase current sensors 41A, 41B are dual-system sensors which detect a common current flowing through the V-phase cable Cv (predetermined object). W-phase current sensors 42A, 42B are attached the W-phase cable Cw (second phase) of the motor 11 to detect a current flowing through the W-phase cable Cw. The W-phase current sensors 42A, 42B are dual-system sensors which detect a common current flowing through the W-phase cable Cw (predetermined object). The current sensors 41A, 41B, 42A, 42B (sensors) output voltages (analog signals) depending on the magnitude of current (physical quantity).

The phase current detection IC 30 (sensor output determination apparatus) is an integrated circuit including an input-output port, a processing circuit, and a communication circuit. The IC 30 receives output voltages IvAa, IvBa, IwAa, IwBa (analog outputs) of the current sensors 41A, 41B, 42A, 42B. The IC 30 determines whether or not the output voltage of the current sensor is normal to transmit digital signals IvAd, IwAd (current values) and digital signals Dr, Dd representing the results of the determinations to the controller 13.

A resolver 45 is attached to the motor 11. The resolver 45 has a known configuration including an exciting coil rotating together with the rotor of the motor 11, and fixed two detection coils. The two detection coils output detection signals, whose amplitudes sinusoidally vary and whose phases are shifted by 90° from each other, based on sinusoidal excitation signals applied to the exciting coil and the rotation angle of the rotor of the motor 11.

The controller 13 is a microcomputer including a CPU, a ROM, a RAM, and an input-output interface. The controller 13 is provided outside the housing 12a of the inverter 12. The controller 13 receives the detection signal and the excitation signal outputted from the resolver 45, and detects a rotation angle θ of the rotor of the motor 11 based on the signals. In addition, the controller 13 communicates with the phase current detection IC 30 according to a predetermined communication standard to receive digital signals IvAd, IwAd, Dr, Dd to be transmitted from the IC 30. Then, the controller 13 controls the switching circuit 21 based on the rotation angle θ and the digital signals IvAd, IwAd representing currents. Specifically, the controller 13 transmits a switching signal to control the switching elements of the switching circuit 21.

Figure 2:
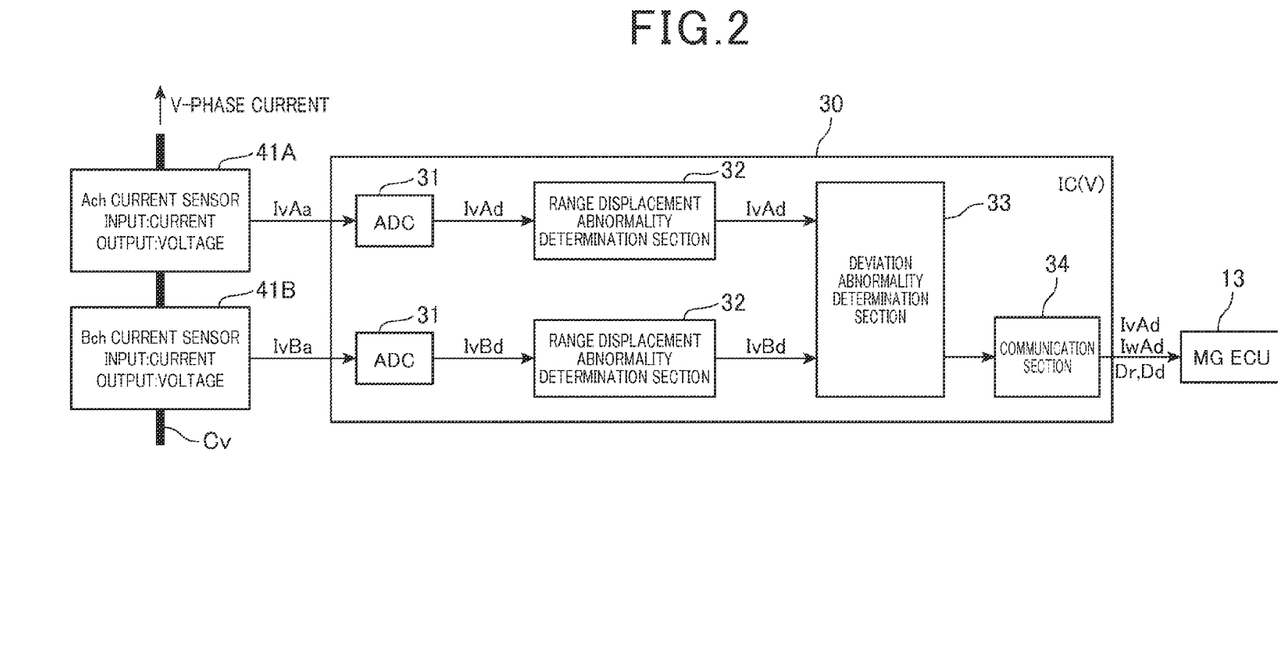
FIG. 2 is a block diagram showing a phase current detection IC.

FIG. 2 is a block diagram showing a phase current detection IC 30. In FIG. 2, a part of the IC 30 is shown which detects current (V-phase current) flowing through the V-phase cable Cv. The IC 30 includes A/D converters 31, range displacement abnormality determination sections 32, a deviation abnormality determination section 33, and a communication section 34, which are realized by the input-output port, the processing circuit, the communication circuit, and the like included in the IC 30.

Figure 3:
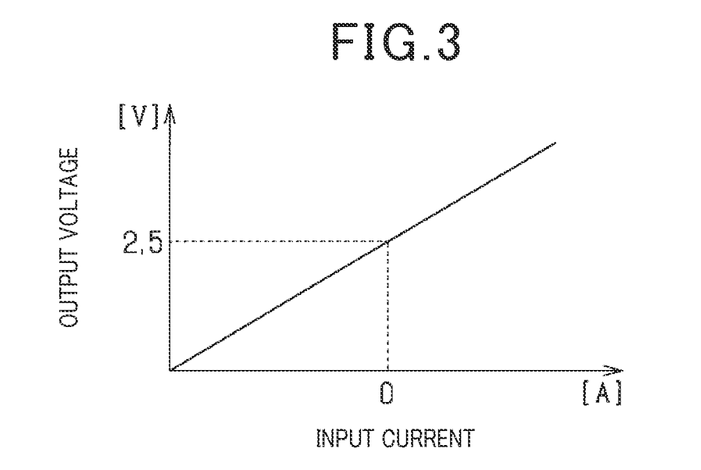
FIG. 3 is a graph showing a relationship between input current and output current of a current sensor.

The V-phase current sensors 41A, 41B respectively output the output voltages IvAa, IvBa depending on the magnitude of the V-phase current flowing through the V-phase cable Cv. Specifically, as shown in FIG. 3, output voltage of the V-phase current sensors 41A, 41B increases in proportion to input current. The output voltage of the V-phase current sensors 41A, 41B is within a range from 0 to 5 V. If the input current is 0 A, the output voltage is 2.5 V.

The A/D converters 31 (conversion sections) receive the output voltages IvAa, IvBa of the V-phase current sensors 41A, 41B, and converts the output voltages IvAa, IvBa to the digital signals IvAd, IvBd representing V-phase currents (hereinafter, referred to as "current values IvAd, IvBd") so as to be outputted. For example, each of the digital signals IvAd, IvBd is formed of 12 bit data.

Figure 4:
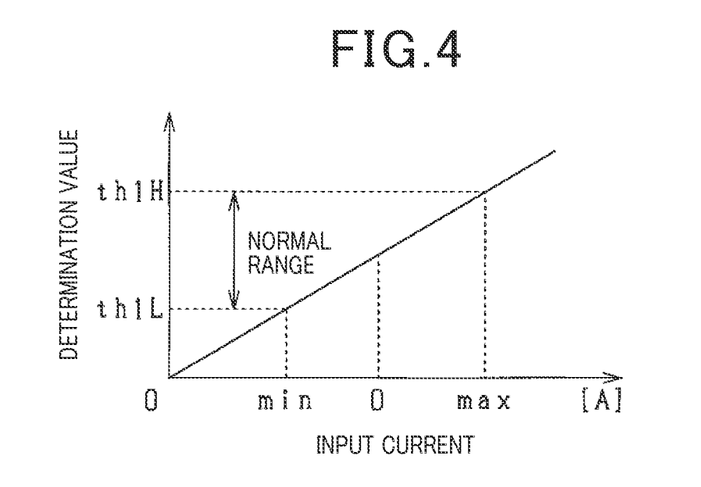
FIG. 4 is a graph showing a normal range of current values with respect to input current.

The range displacement abnormality determination sections 32 (determination sections) receive the current values IvAd, IvBd, and determines whether or not each of the current values IvAd, IvBd is within a normal range (first range) (first determination). Specifically, as shown in FIG. 4, the normal range is between a lower limit th1L and an upper limit th1H. The lower limit th1L corresponds to the minimum value of assumed input current. The upper limit th1H corresponds to the maximum value of assumed input current.

Figure 5:
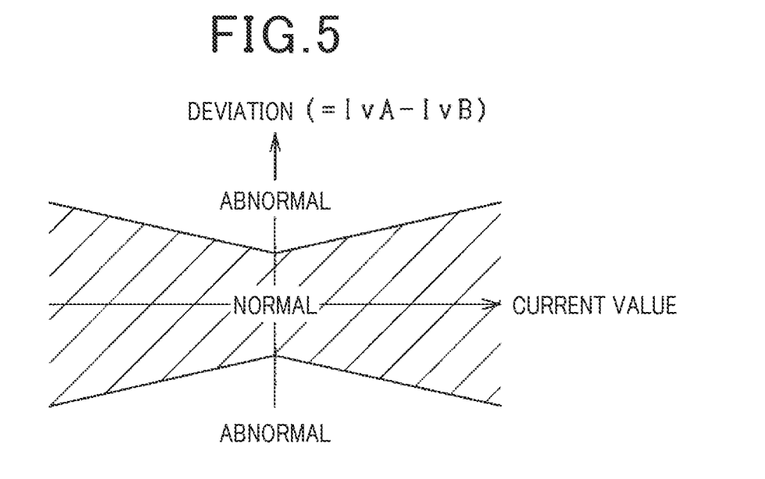
FIG. 5 is a map showing a normal range of current deviation with respect to current values.

The deviation abnormality determination section 33 (determination section) determines whether or not the deviation between the current value IvA (actual value), which is calculated based on the output voltage of the V-phase current sensor 41A, and the current value IvB (actual value), which is calculated based on the output voltage of the V-phase current sensor 41B, is within the normal range (deviation abnormality determination). Specifically, as shown in FIG. 5, the deviation abnormality determination section 33 determines whether or not the deviation between the current value IvA and the current value IvB is within the normal range set depending on the magnitude of the current value. As hatched in FIG. 5, the normal range is wider as the absolute value of the current value is larger. This is because, as the current value increases, a gain error increases when converting the output voltage IvAa to the current value IvAd. Note that a median value of the normal range may be learned based on the current value. That is, the normal range may be set depending on output characteristics of the current sensors 41A, 41B.

Figure 6:
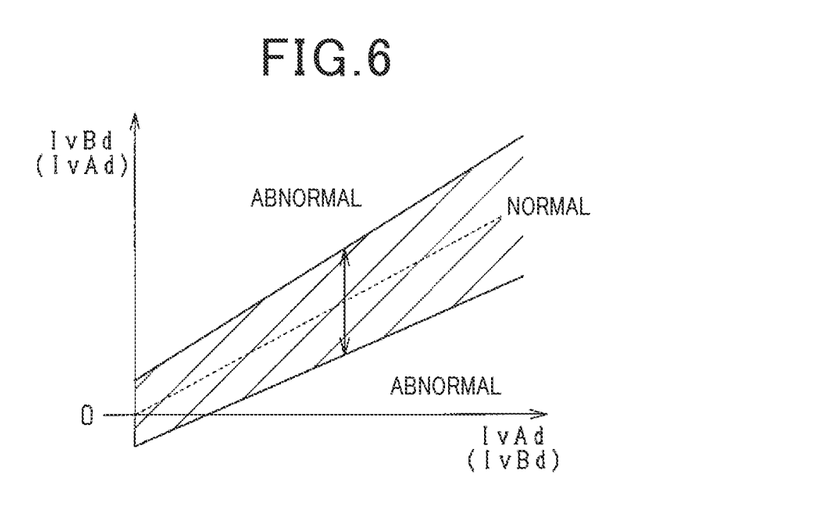
FIG. 6 is a map showing a normal range of current values of a current sensor B with respect to current values of a current sensor A.

Specifically, the above deviation abnormality determination is performed by using a map shown in FIG. 6. That is, with respect to the current value IvAd (IvBd), if the current value IvBd (IvAd) is within a hatched range shown in FIG. 6, the deviation abnormality determination section 33 determines that the deviation between the current values IvAd and IvBd is within a normal range (second range) (second determination). In other words, the deviation abnormality determination section 33 determines whether or not the absolute value of the difference between the current value IvAd and the current value IvBd is smaller than half of the width of the normal range. The normal range is set wider as the current value IvAd (IvBd) is larger. Thus, in the map of FIG. 6, a smaller value which is the current value IvAd or IvBd is used for the horizontal axis when setting the normal range. That is, a narrower normal range is set which is the normal range set by the current value IvAd or IvBd. This is because, when using a larger value which is the current value IvAd or IvBd, a wider normal range may be erroneously set.

The communication section 34 (transmission section) transmits any one of the current values IvAd and IwAd, the digital signal Dr representing a determination result of the range displacement abnormality determination sections 32, and the digital signal Dd representing a determination result of the deviation abnormality determination section 33 to the controller 13 (the outside of the IC 30). The communication section 34 transmits the current value IvAd, the digital signal Dr (hereinafter, referred to as "range displacement abnormality flag Dr"), and the digital signal Dd (hereinafter, referred to as "deviation abnormality flag Dd") to the controller 13.

In addition, the IC 30 similarly includes a part detecting a current (W-phase current) flowing through the W-phase cable Cw. The part detecting the W-phase current may be common to the part detecting the V-phase current. A configuration similar to the part detecting the V-phase current may be provided as the part detecting the W-phase current. The part detecting the W-phase current receives the output voltages IwAa, IwBa of the W-phase current sensors 42A, 42B to perform a process similar to that described above.

Figure 7:
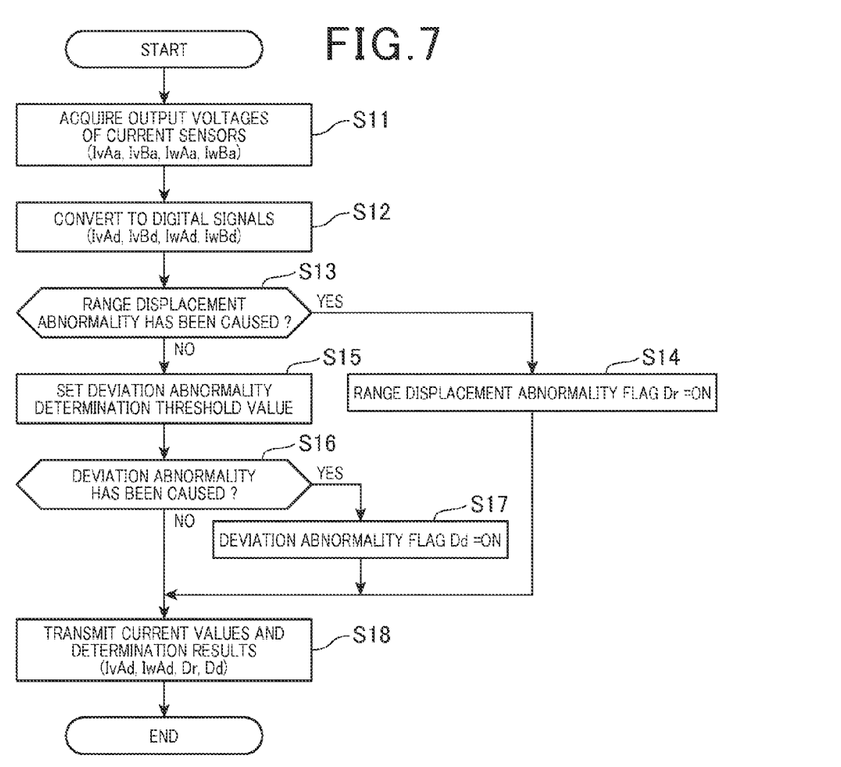
FIG. 7 is a flowchart showing a procedure of output determination of the current sensor.

Next, with reference to the flowchart shown in FIG. 7, a procedure is explained which determines whether or not analog outputs of the current sensors 41A, 41B, 42A, 42B are normal. The process is repeatedly performed at a predetermined period by the phase current detection IC 30.

First, in step S11, the phase current detection IC 30 acquires the output voltages IvAa, IvBa, IwAa, IwBa of the current sensors 41A, 41B, 42A, 42B. In step S12, the phase current detection IC 30 converts the acquired output voltages IvAa, IvBa, IwAa, IwBa to the digital signals IvAd, IvBd, IwAd, IwBd.

Next, in step S13, the phase current detection IC 30 determines whether or not a range displacement abnormality has been caused in the digital signals IvAd, IvBd, IwAd, IwBd (current values). Specifically, the phase current detection IC 30 determines whether or not each of the current values IvAd, IvBd, IwAd, IwBd is within a range from the lower limit th1L to the upper limit th1H. In the determination of step S13, if determining that a range displacement abnormality has been caused in any of the current values IvAd, IvBd, IwAd, IwBd (S13: YES), in step S14, the phase current detection IC 30 sets the range displacement abnormality flag Dr on. Specifically, the digital signal Dr representing a determination result of a range displacement abnormality is configured by one bit of data. If a range displacement abnormality has been caused, the digital signal Dr is set to 1. If a range displacement abnormality has not been caused, the digital signal Dr is set to 0.

In the determination of step S13, if determining that a range displacement abnormality has not been caused in either of the current values IvAd, IvBd, IwAd, IwBd (S13: NO), in step S15, the phase current detection IC 30 sets a threshold value used for deviation abnormality determination. Specifically, with reference to the map shown in FIG. 6, the phase current detection IC 30 selects a narrower normal range from the normal ranges respectively set by the V-phase current value IvAd and IvBd. Then, half of the width of the normal range is set as a threshold value $th2v$ used for deviation abnormality determination of the V phase. Similarly, a threshold value $th2w$ used for deviation abnormality determination of the W phase is set.

Next, in step S16, the phase current detection IC 30 determines whether or not a deviation abnormality has been caused in each of the V-phase current values IvAd, IvBd, and the W-phase current values IwAd, IwBd by using the set threshold values $th2v$, $th2w$. Specifically, the phase current detection IC 30 determines whether or not the absolute value of the difference between the current value IvAd and the current value IvBd of the V-phase is smaller than the determination value $th2v$. In addition, the phase current detection IC 30 determines whether or not the absolute value of the difference between the current value IwAd and the current value IwBd of the W-phase is smaller than the determination value $th2w$. That is, with respect to the current value IwAd (IwBd), if the current value IwBd (IwAd) is within a hatched range shown in FIG. 6, the phase current detection IC 30 determines that the deviation between the current values IwAd and IwBd is within a normal range (third range) (second determination).

In the determination of step S16, if determining that a deviation abnormality has been caused in any of the V-phase current values IvAd, IvBd and W-phase current values IwAd, IwBd (S16: YES), in step S17, the phase current detection IC 30 sets the deviation abnormality flag Dd on. Specifically, the digital signal Dd representing a determination result of a deviation abnormality is configured by one bit of data. If a deviation abnormality has been caused, the digital signal Dd is set to 1. If a deviation abnormality has not been caused, the digital signal Dd is set to 0.

After performing any one of the steps S14, S16, and S17, in step S18, the phase current detection IC 30 transmits the current values IvAd, IvBd, the range displacement abnormality flag Dr, and the deviation abnormality flag Dd to the controller 13. Then, the phase current detection IC 30 halts the process (END). Note that the step S12 corresponds to a process performed by a conversion section, the steps S13 to S17 correspond to a process performed by a determination section, and the step S18 corresponds to a process performed by a transmission section.

The controller 13 communicates with the phase current detection IC 30 according to the predetermined communication standard to receive the current values IvAd, IwAd, the range displacement abnormality flag Dr, and the deviation abnormality flag Dd transmitted from the IC 30. If any of the range displacement abnormality flag Dr and the deviation abnormality flag Dd is on, the controller 13 performs a predetermined abnormality handling process. In addition, if both the range displacement abnormality flag Dr and the deviation abnormality flag Dd are off, the controller 13 controls the switching circuit 21 based on the rotation angle θ and the current values IvAd, IwAd.

The above described embodiment provides the following advantages.

The current values IvAd, IwAd, the range displacement abnormality flag Dr, and the deviation abnormality flag Dd are transmitted to the controller 13 provided outside the housing 12a of the inverter 12. Since each of the range displacement abnormality flag Dr and the deviation abnormality flag Dd is formed of one bit of data, the amounts of data thereof can be smaller than those of the current values IvBd, IwBd. Thus, for example, compared with a case where both the V-phase current values IvAd, IwAd are transmitted, the amount of data to be transmitted to the controller 13 can be smaller. Thus, in the IC 30 which determines whether or not outputs of the current sensors 41A, 41B, 42A, 42B are normal, the amount of data to be transmitted to the outside of the IC 30 can be prevented from increasing.

The two current sensors 41A, 41B detect a current flowing through the V-phase cable Cv. Thus, if analog outputs of the two current sensors 41A, 41B are normal, the current represented by the digital signal IvBd can be regarded as similar to the current represented by the transmitted digital signal IvAd. In addition, a current Iu flowing through the U-phase cable Cu can be calculated from the current values IvAd, IwAd.

In the first determination, it is determined whether or not each of the two digital signals IvAd, IvBd representing current of the V-phase and the two digital signals IwAd, IwBd representing current of the W-phase is within the normal range. In the second determination, it is determined whether or not the deviation between the two digital signals IvAd and IvBd representing current of the V-phase is within the normal range and whether or not the deviation between the two digital signals IwAd and IwBd representing current of the W-phase is within the normal range. The digital signal representing the results of the determinations includes the range displacement abnormality flag Dr representing the result of the first determination and the deviation abnormality flag Dd representing the result of the second determination. Thus, while preventing the amount of data to be transmitted from increasing, the type of abnormality can be identified based on the results of the first determination and the second determination.

The phase current detection IC 30 is housed in the housing 12a of the inverter 12 controlling currents flowing through phases of the motor 11. In contrast, the controller 13 is provided outside the housing 12a. Thus, compared with a configuration in which the controller 13 is housed in the housing 12a of the inverter 12, the distance between the IC 30 (communication section 34) and the controller 13 becomes longer. However, since the IC 30 transmits the digital signals IvAd, IwAd representing currents and the digital signals Dr, Dd representing the results of the determinations to the outside of the IC 30, noise can be prevented from being superimposed on these signals.

Second Embodiment

Figure 8:
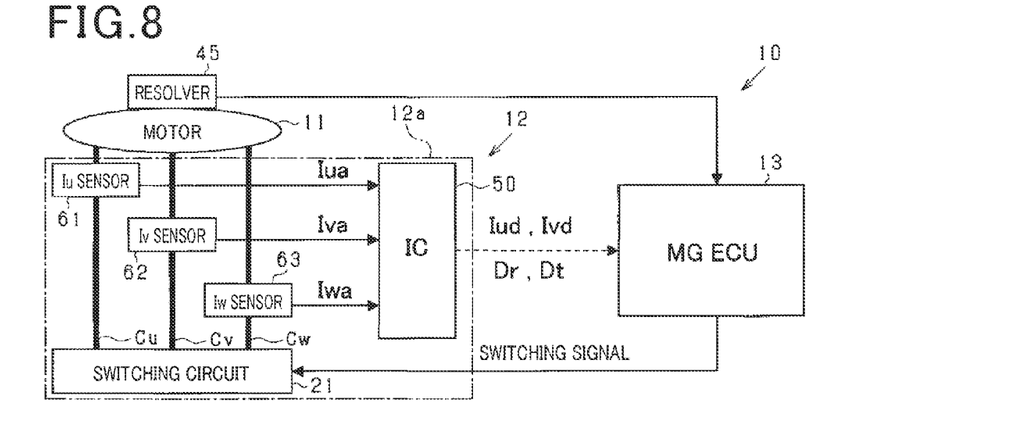
FIG. 8 is a schematic diagram showing a control system of a motor according to a second embodiment.

The second embodiment differs from the first embodiment in including current sensors 61, 62, 63 respectively detecting currents flowing through the cables Cu, Cv, Cw of the motor 11. Accordingly, a phase current detection IC 50, which determines whether or not analog outputs of the current sensors 61, 62, 63 are normal, differs from the phase current detection IC 30 of the first embodiment. Hereinafter, the present embodiment is described focusing on the differences from the first embodiment. Note that the components identical with or similar to those in the first embodiment are given the same reference numerals for the sake of omitting unnecessary explanation.

As shown in FIG. 8, the current sensors 61, 62, 63 are attached to the U-phase cable Cu, the V-phase cable Cv, and the W-phase cable Cw of the motor 11 to detect currents flowing through the cables Cu, Cv, and Cw. The current sensors 61, 62, 63 (sensor) output voltage (analog signal) corresponding to the magnitude of current (physical quantity).

The phase current detection IC 50 (sensor output determination apparatus) is an integrated circuit including an input-output port, a processing circuit, and a communication circuit. The IC 50 receives output voltages Iua, Iva, Iwa (analog outputs) of the current sensors 61, 62, 63. The IC 50 determines whether or not the output voltages of the current sensors 61, 62, 63 are normal to transmit digital signals Iud, Ivd (current values) representing currents and digital signals Dr, Dt representing results of determinations to the controller 13.

The controller 13 is provided outside the housing 12a of the inverter 12. The controller 13 communicates with the phase current detection IC 50 according to the predetermined communication standard to receive digital signals Iud, Ivd, Dr, Dt to be transmitted from the IC 50. Then, the controller 13 controls the switching circuit 21 based on the rotation angle θ and the digital signals Iud, Ivd representing currents.

Figure 9:
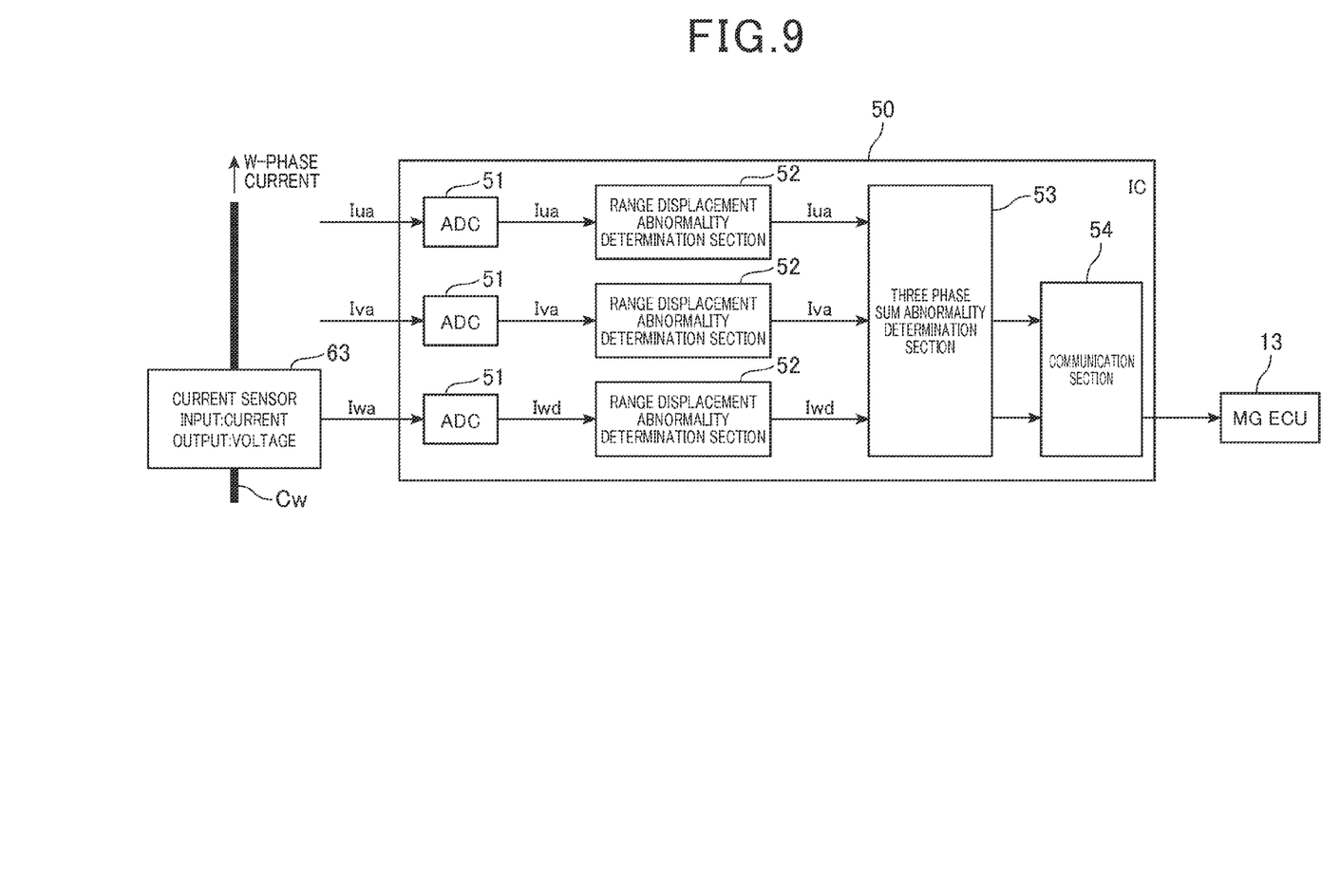
FIG. 9 is a block diagram showing a phase current detection IC.

FIG. 9 is a block diagram showing the phase current detection IC 50. In FIG. 9, a part of the IC 50 is shown which detects current (W-phase current) flowing through the W-phase cable Cw. The IC 50 includes A/D converters 51, range displacement abnormality determination sections 52, a three phase sum abnormality determination section 53, and a communication section 54, which are realized by the input-output port, the processing circuit, the communication circuit and the like included in the IC 50.

The current sensors 61, 62, 63 (only the current sensor 63 is shown) have configurations similar to that of the current sensor 41A or the like of the first embodiment, and respectively output the output voltages Iua, Iva, Iwa.

The A/D converters 51 (conversion sections) have configurations similar to that of the A/D converter 31 of the first embodiment. The A/D converters 51 receive the output voltages Iua, Iva, Iwa of the current sensors 61, 62, 63 and convert the output voltages Iua, Iva, Iwa to the digital signals Iud, Ivd, Iwd representing currents (hereinafter, referred to as "current values Iud, Ivd, Iwd") so as to be outputted. For example, each of the digital signals Iud, Ivd, Iwd is formed of 12 bit of data.

The range displacement abnormality determination sections 52 (determination sections) have configurations similar to that of the range displacement abnormality determination section 32 of the first embodiment. The range displacement abnormality determination section 52 receives the current values Iud, Ivd, Iwd and determines whether or not each of the current values Iud, Ivd, Iwd is within a normal range (first range) (first determination).

Figure 10:
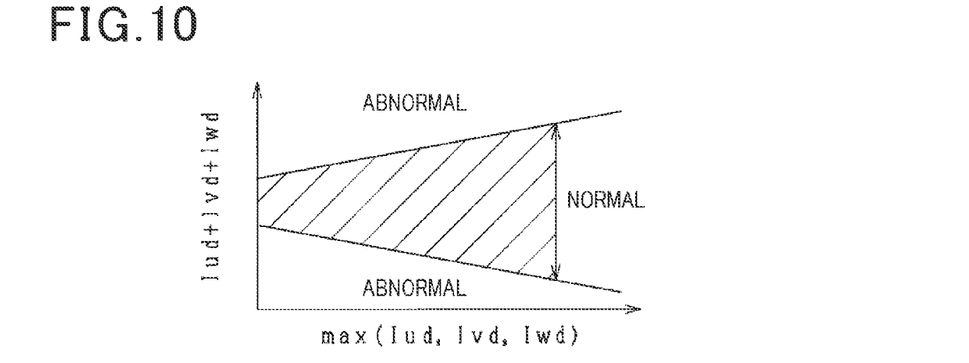
FIG. 10 is a map showing a normal range of a three phase sum with respect to current values.

The three phase sum abnormality determination section 53 (determination section) determines whether or not the sum of the current values Iud, Ivd, Iwd is within the normal range (second range) (second determination). Specifically, as shown in FIG. 10, the three phase sum abnormality determination section 53 determines whether or not the sum of the current values Iud, Ivd, Iwd is within the normal range set depending on the magnitude of the current value. As hatched in FIG. 10, the normal range is wider as the current values Iud, Ivd, Iwd are larger. This is because, as the current value increases, a gain error increases when converting the output voltage Iua and the like to the current value Iud and the like.

In addition, in the map of FIG. 10, the largest value among the current values Iud, Ivd, and Iwd is used for the horizontal axis when setting the normal range. This is because, the current values Iud, Ivd, and Iwd periodically vary with phases thereof being shifted from each other, and the largest current value includes the largest error. Note that a median value of the normal range may be learned based on the current value. That is, the normal range may be set depending on output characteristics of the current sensors 61, 62, 63.

The communication section 54 (transmission section) has a configuration similar to that of the communication section 34 of the first embodiment. The communication section 54 transmits any two of the current values Iud, Ivd, Iwd, the digital signal Dr representing a determination result of the range displacement abnormality determination sections 52, and the digital signal Dt representing a determination result of the three phase sum abnormality determination section 53 to the controller 13 (the outside of the IC 50). The communication section 54 transmits the current values Iud, Ivd, the digital signal Dr (hereinafter, referred to as "range displacement abnormality flag Dr"), and the digital signal Dt (hereinafter, referred to as "three phase sum abnormality flag Dt") to the controller 13.

Figure 11:
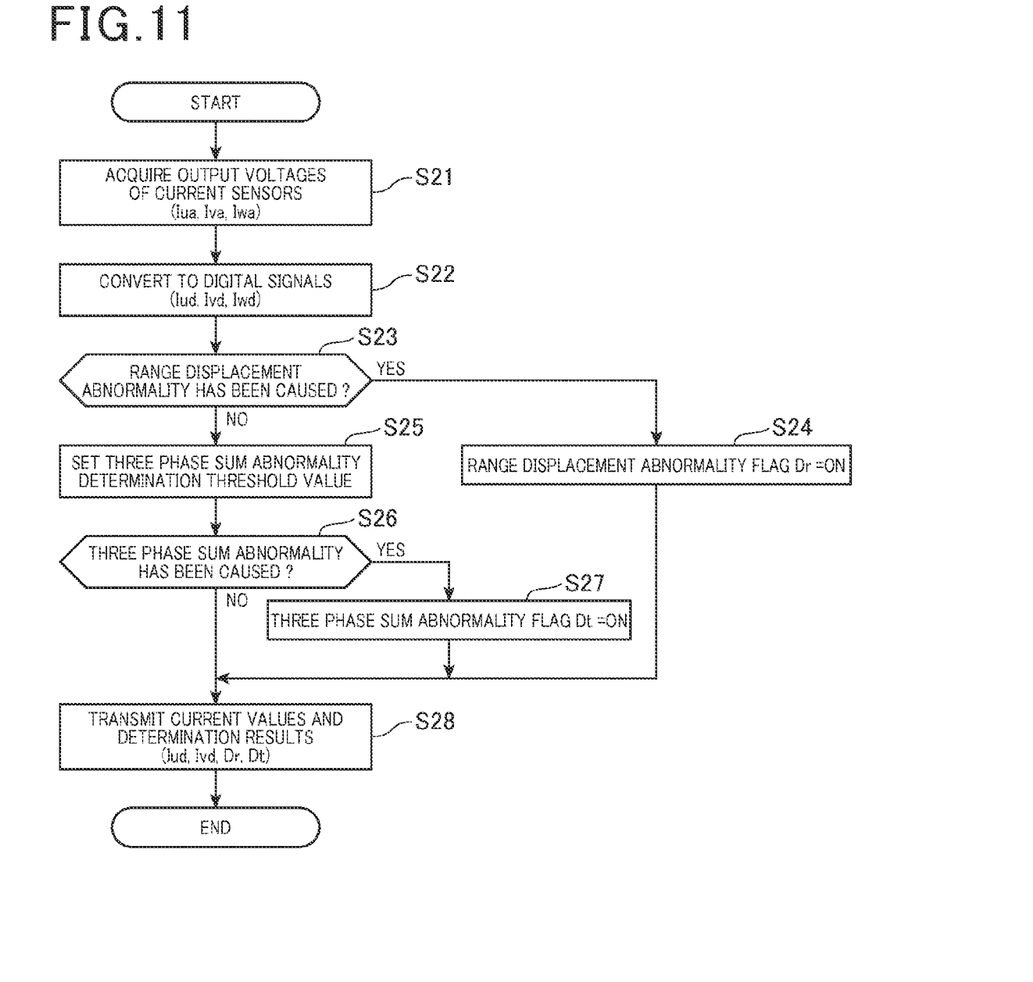
FIG. 11 is a flowchart showing a procedure of output determination of a current sensor.

Next, with reference to the flowchart shown in FIG. 11, a procedure is explained which determines whether or not analog outputs of the current sensors 61, 62, 63 are normal. The process is repeatedly performed at a predetermined period by the phase current detection IC 50.

First, in step S21, the phase current detection IC 50 acquires the output voltages Iua, Iva, Iwa of the current sensors 61, 62, 63. In step S22, the phase current detection IC 50 converts the acquired output voltages Iua, Iva, Iwa to the digital signals Iud, Ivd, Iwd.

Next, in step S23, the phase current detection IC 50 determines whether or not a range displacement abnormality has been caused in the digital signals Iud, Ivd, Iwd (current values). In the determination of step S23, if determining that a range displacement abnormality has been caused in any of the current values Iud, Ivd, Iwd (S23: YES), the phase current detection IC 50 sets the range displacement abnormality flag Dr on (S24). Specifically, the digital signal Dr representing a determination result of a range displacement abnormality is configured by one bit of data. If a range displacement abnormality has been caused, the digital signal Dr is set to 1. If a range displacement abnormality has not been caused, the digital signal Dr is set to 0.

In the determination of step S23, if determining that a range displacement abnormality has not been caused in either of the current values Iud, Ivd, Iwd (S23: NO), in step S15, the phase current detection IC 50 sets a threshold value used for three phase sum abnormality determination. Specifically, with reference to the map shown in FIG. 10, the phase current detection IC 50 selects a normal range based on the largest value among the current values Iud, Ivd, Iwd. Then, a lower limit of the normal range is set as a threshold value th2L used for the three phase sum abnormality determination. An upper limit of the normal range is set as a threshold value th2H used for the three phase sum abnormality determination.

Next, in step S26, the phase current detection IC 50 determines whether or not a three phase sum abnormality has been caused in the current values Iud, Ivd, Iwd by using the set threshold values th2L, th2H. Specifically, the phase current detection IC 50 determines whether or not the sum of the current values Iud, Ivd, Iwd is larger than the threshold value th2L and smaller than the threshold value th2H.

In the determination of step S26, if determining that a three phase sum abnormality has been caused in the current values Iud, Ivd, Iwd (S26: YES), the phase current detection IC 50 sets the three phase sum abnormality flag Dt on (S27). Specifically, the digital signal Dt representing a determination result of a three phase sum abnormality is configured by one bit of data. If a three phase sum abnormality has been caused, the digital signal Dt is set to 1. If a three phase sum abnormality has not been caused, the digital signal Dt is set to 0.

After performing any one of the steps S24, S26, and S27, in step S28, the phase current detection IC 50 transmits the current values Iud, Ivd, the range displacement abnormality flag Dr, and the three phase sum abnormality flag Dt to the controller 13. Then, the phase current detection IC 50 halts the process (END). Note that the step S22 corresponds to a process performed by the conversion section, the steps S23 to S27 correspond to a process performed by the determination section, and the step S28 corresponds to a process performed by the transmission section.

The controller 13 communicates with the phase current detection IC 50 according to the predetermined communication standard to receive the current values Iud, Ivd, Iwd, the range displacement abnormality flag Dr, and the three phase sum abnormality flag Dt transmitted from the IC 50. If any of the range displacement abnormality flag Dr and the three phase sum abnormality flag Dt is on, the controller 13 performs a predetermined abnormality handling process. In addition, if both the range displacement abnormality flag Dr and the three phase sum abnormality flag Dt are off, the controller 13 controls the switching circuit 21 based on the rotation angle θ and the current values Iud, Ivd.

The above described embodiment provides the following advantages. Note that advantages different from those of the first embodiment are described.

The current values Iud, Ivd, the range displacement abnormality flag Dr, and the three phase sum abnormality flag Dt are transmitted to the controller 13 provided outside the housing 12a of the inverter 12. Since each of the range displacement abnormality flag Dr and the three phase sum abnormality flag Dt is formed of one bit of data, the amounts of data thereof can be smaller than that of the current value Iwd. Thus, compared with a case where all the current values Iud, Ivd, IwAd are transmitted, the amount of data to be transmitted to the controller 13 can be smaller. Thus, in the IC 50 which determines whether or not outputs of the current sensors 61, 62, 63 are normal, the amount of data to be transmitted to the outside of the IC 50 can be prevented from increasing. Furthermore, the current Iw flowing through the W-phase cable Cw can be calculated from the current values Iud, Ivd.

In the first determination, it is determined whether or not each of the three digital signals Iud, Ivd, Iwd representing currents of the respective phases is within the normal range. In the second determination, it is determined whether or not the sum of the three digital signals Iud, Ivd, Iwd representing currents of the respective phases is within the normal range. The digital signal representing the results of the determinations includes the range displacement abnormality flag Dr representing the result of the first determination and the three phase sum abnormality flag Dt representing the result of the second determination. Thus, while preventing the amount of data to be transmitted from increasing, the type of abnormality can be identified based on the results of the first determination and the second determination.

The above embodiments can be modified as described below.

The phase current detection ICs 30, 50 may perform any one of the first determination and the second determination to transmit only the result of the determination to the controller 30 as a result of the determinations of outputs of the current sensors.

As shown in FIG. 6, the normal range of the deviation between the current values IvAd and IvBd is set wider as the current value IvAd (IvBd) is larger. However, the normal range of the deviation between the current values IvAd and IvBd may be constant regardless of the magnitude of the current value IvAd (IvBd).

As shown in FIG. 10, the normal range of the sum of the current values Iud, Ivd, Iwd is set wider as the current values Iud, Ivd, Iwd are larger. However, the normal range of the sum of the current values Iud, Ivd, Iwd may be constant regardless of the magnitudes of the current values Iud, Ivd, Iwd.

The three-phase rotary machine is not limited to the motor 11 but may be an alternator (generator) or a motor generator.

The ICs 30, 50 are not limited to transmitting digital signals to the controller 13 provided outside the housing 12a of the inverter 12, but may transmit digital signals to the outside of the ICs 30, 50. The communication may be either of cable communication and radio communication.

The component including two sensors detecting common physical quantity of a predetermined object may be a dual-system position sensor, which detects openings of a throttle valve of an engine, a dual-system pressure sensor, which detects pressure in a common rail (accumulator) of a diesel engine, or the like.

Hereinafter, aspects of the above-described embodiments will be summarized.

As an aspect of the embodiment, a sensor output determination apparatus (30) is provided which determines whether or not analog outputs of two current sensors (41A, 41B) detecting a current of a first phase of a three-phase rotary machine (11) and analog outputs of two current sensors (42A, 42B) detecting a current of a second phase of the three-phase rotary machine (11) are normal. The apparatus includes: a converter (31) which converts the analog outputs of the two current sensors of the first phase and the analog outputs of the two current sensors of the second phase to two digital signals representing the current of the first phase and two digital signals representing the current of the second phase; a determination section (32, 33) which determines whether or not the analog outputs of the two current sensors of the first phase are normal based on the two digital signals representing the current of the first phase, and determines whether or not the analog outputs of the two current sensors of the second phase are normal based on the two digital signals representing the current of the second phase; and a transmission section (34) which transmits any one of the two digital signals representing the current of the first phase, any one of the two digital signals representing the current of the second phase, and a digital signal representing a result of the determinations of the determination section, to the outside of the apparatus.

According to the above configuration, a current of the first phase of the three-phase rotary machine is detected by two current sensors, and a current of the second phase of the three-phase rotary machine is detected by two current sensors. The converter converts the analog outputs of the two current sensors of the first phase to two digital signals representing the current of the first phase. In addition, the converter converts the analog outputs of the two current sensors of the second phase to two digital signals representing the current of the second phase. The determination section determines whether or not the analog outputs of the two current sensors of the first phase are normal based on the two digital signals representing the current of the first phase, and determines whether or not the analog outputs of the two current sensors of the second phase are normal based on the two digital signals representing the current of the second phase. Then, the transmission section transmits any one of the two digital signals representing the current of the first phase, any one of the two digital signals representing the current of the second phase, and a digital signal representing a result of the determinations of the determination section, to the outside of the apparatus.

Since the digital signal representing the result of the determinations of the determination section can be expressed by, for example, one bit of data, the amount of data thereof can be smaller than that of a digital signal representing a current. Thus, for example, compared with a case where both the two digital signals representing the current of the first phase are transmitted, the amount of data to be transmitted to the outside of the apparatus can be smaller. Thus, in the apparatus which determines whether or not outputs of the current sensors are normal, the amount of data to be transmitted to the outside of the apparatus can be prevented from increasing. In addition, the current flowing through the first phase is detected by the two current sensors. Hence, if analog outputs of the two current sensors are normal, the current represented by one remaining digital signal can be regarded as similar to the current represented by one transmitted digital signal. In addition, the current flowing through the third phase can be calculated from the current represented by the digital signal of the first phase and the current represented by the digital signal of the second phase.

As another aspect of the embodiment, a sensor output determination apparatus (50) is provided which determines whether or not analog outputs of current sensors (61, 62, 63) detecting currents of respective phases of a three-phase rotary machine (11) are normal. The apparatus includes: a converter (51) which converts the analog outputs of the current sensors of the respective phases to digital signals representing the currents of the respective phases; a determination section (52, 53) which determines whether or not the analog outputs of the current sensors of the respective phases are normal based on the digital signals representing the currents of the respective phases; and a transmission section (54) which transmits any two of the digital signals representing the currents of the respective phases, and a digital signal representing a result of the determination of the determination section, to the outside of the apparatus.

According to the above configuration, currents of respective phases of the three-phase rotary machine are detected by the respective current sensors. The converter converts analog outputs of the current sensors of the respective phases to digital signals representing the currents of the respective phases. The determination section determines whether or not the analog outputs of the current sensors of the respective phases are normal based on the digital signals representing the currents of the respective phases. The transmission section transmits any two of the digital signals representing the currents of the respective phases, and a digital signal representing a result of the determination of the determination section, to the outside of the apparatus.

Since the digital signal representing the result of the determinations of the determination section can be expressed by, for example, one bit of data, the amount of data thereof can be smaller than that of a digital signal representing a current. Thus, compared with a case where all the three digital signals representing the currents of the respective phases are transmitted, the amount of data to be transmitted to the outside of the apparatus can be smaller. Thus, in the apparatus which determines whether or not outputs of the current sensors are normal, the amount of data to be transmitted to the outside of the apparatus can be prevented from increasing. In addition, the current flowing through one remaining phase can be calculated from currents flowing through two phases represented by the two digital signals.

As another aspect of the embodiment, a sensor output determination apparatus (30) is provided which determines whether or not analog outputs of two sensors (41A and 41B, 42A and 42B) detecting a common physical quantity of a predetermined object (11) are normal. The apparatus includes: a converter (31) which converts the analog outputs of the two sensors to two digital signals representing the physical quantity; a determination section (32, 33) which determines whether or not the analog outputs of the two sensors are normal based on the two digital signals; and a transmission section (34) which transmits any one of the two digital signals and a digital signal representing a result of the determination of the determination section, to the outside of the apparatus.

According to the above configuration, a common physical quantity of a predetermined object is detected by two sensors. The converter converts the analog outputs of the two sensors to two digital signals representing the physical quantity. The determination section determines whether or not the analog outputs of the two sensors are normal based on the two digital signals. In addition, the transmission section transmits any one of the two digital signals and a digital signal representing a result of the determination of the determination section, to the outside of the apparatus.

Since the digital signal representing the result of the determinations of the determination section can be expressed by, for example, one bit of data, the amount of data thereof can be smaller than that of a digital signal representing a physical quantity. Thus, compared with a case where both the two digital signals representing the physical quantity are transmitted, the amount of data to be transmitted to the outside of the apparatus can be smaller. Thus, in the apparatus which determines whether or not outputs of the sensors are normal, the amount of data to be transmitted to the outside of the apparatus can be prevented from increasing. In addition, the two sensors detect a common physical quantity of a predetermined object. Hence, if analog outputs of the two sensors are normal, the physical quantity represented by one remaining digital signal can be regarded as similar to the physical quantity represented by one transmitted digital signal.

It will be appreciated that the present invention is not limited to the configurations described above, but any and all modifications, variations or equivalents, which may occur to those who are skilled in the art, should be considered to fall within the scope of the present invention.

What is claimed is:

1. A sensor output determination apparatus which determines whether analog outputs of two current sensors detecting a current of a first phase of a three-phase rotary machine and analog outputs of two current sensors detecting a current of a second phase of the three-phase rotary machine are normal, the apparatus comprising:
   a converter which converts the analog outputs of the two current sensors of the first phase and the analog outputs of the two current sensors of the second phase to two digital signals representing the current of the first phase and two digital signals representing the current of the second phase;
   a determination section which determines whether the analog outputs of the two current sensors of the first phase are normal based on the two digital signals representing the current of the first phase, and determines whether the analog outputs of the two current sensors of the second phase are normal based on the two digital signals representing the current of the second phase; and
   a transmission section which transmits only one of the two digital signals representing the current of the first phase, only one of the two digital signals representing the current of the second phase, and a digital signal representing a result of the determinations of the determination section, to a controller that is outside of the sensor output determination apparatus.

2. The sensor output determination apparatus according to claim 1, wherein
   the determination section performs a first determination of whether the two digital signals representing the current of the first phase and the two digital signals representing the current of the second phase are within a first range is determined, and a second determination of whether a deviation between the two digital signals representing the current of the first phase is within a second range and whether a deviation between the two digital signals representing the current of the second phase is within a third range are determined, and
   the digital signal representing the result of the determinations of the determination section includes a digital signal representing a result of the first determination and a digital signal representing a result of the second determination.

3. A sensor output determination apparatus which determines whether analog outputs of current sensors detecting currents of respective phases of a three-phase rotary machine are normal, the apparatus comprising:
   a converter which converts the analog outputs of the current sensors of the respective phases to digital signals representing the currents of the respective phases;
   a determination section which determines whether the analog outputs of the current sensors of the respective phases are normal based on the digital signals representing the currents of the respective phases; and
   a transmission section which transmits only two of the digital signals representing the currents of the respective phases, and a digital signal representing a result of the determination of the determination section, to a controller that is outside of the sensor output determination apparatus.

4. The sensor output determination apparatus according to claim 3, wherein
   the determination section performs a first determination of whether the digital signals representing the currents of the respective phases are within a first range is determined, and a second determination of whether a sum of the digital signals representing the currents of the respective phases is within a second range is determined, and
   the digital signal representing the result of the determinations of the determination section includes a digital signal representing a result of the first determination and a digital signal representing a result of the second determination.

5. The sensor output determination apparatus according to claim 1, wherein
   the sensor output determination apparatus is housed in a housing of an inverter controlling currents flowing through the phases of the three-phase rotary machine, and
   the transmission section transmits the digital signal to a controller provided outside the housing.

6. A sensor output determination apparatus which determines whether analog outputs of two sensors detecting a physical quantity in common of a predetermined object are normal, the apparatus comprising:
   a converter which converts the analog outputs of the two sensors to two digital signals representing the physical quantity;
   a determination section which determines whether the analog outputs of the two sensors are normal based on the two digital signals; and
   a transmission section which transmits only one of the two digital signals and a digital signal representing a result of the determination of the determination section, to a controller that is outside of the sensor output determination apparatus.

7. The sensor output determination apparatus according to claim 6, wherein the determination section performs a first determination of whether the two digital signals representing the physical quantity are within a first range is determined, and a second determination of whether a deviation between the two digital signals representing the physical quantity is within a second range, and the digital signal representing the result of the determination of the determination section includes a digital signal representing a result of the first determination and a digital signal representing a result of the second determination.

* * * * *